(12) United States Patent
Huang

(10) Patent No.: US 10,804,860 B2
(45) Date of Patent: Oct. 13, 2020

(54) GAIN AMPLIFIER FOR REDUCING INTER-CHANNEL ERROR

(71) Applicant: NOVATEK MICROELECTRONICS CORP., HsinChu (TW)

(72) Inventor: Kuo-Sheng Huang, Hsinchu (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/372,491

(22) Filed: Apr. 2, 2019

(65) Prior Publication Data

US 2019/0305730 A1    Oct. 3, 2019

Related U.S. Application Data

(60) Provisional application No. 62/651,287, filed on Apr. 2, 2018.

(51) Int. Cl.
| | | |
|---|---|---|
| *G09G 3/00* | (2006.01) | |
| *H03F 1/26* | (2006.01) | |
| *H03F 3/45* | (2006.01) | |
| *G09G 3/3208* | (2016.01) | |

(52) U.S. Cl.
CPC ............... *H03F 1/26* (2013.01); *G09G 3/006* (2013.01); *G09G 3/3208* (2013.01); *H03F 3/45071* (2013.01); *G09G 2310/0291* (2013.01); *G09G 2320/043* (2013.01); *G09G 2330/12* (2013.01); *H03F 2200/228* (2013.01); *H03F 2200/252* (2013.01); *H03F 2200/267* (2013.01); *H03F 2200/471* (2013.01);
(Continued)

(58) Field of Classification Search
CPC ....... H03F 1/26; H03F 3/45071; G09G 3/006; G09G 3/3208; G09G 2310/0291; G09G 2320/043; G09G 2330/12
See application file for complete search history.

(56) References Cited

U.S. PATENT DOCUMENTS

| 4,439,693 A | 3/1984 | Lucas et al. | |
|---|---|---|---|
| 7,486,266 B2 * | 2/2009 | Kim | ........................ G09G 5/399 345/102 |

(Continued)

FOREIGN PATENT DOCUMENTS

| CN | 101930706 A | 12/2010 |
|---|---|---|
| CN | 102955611 A | 3/2013 |
| CN | 104517566 A | 4/2015 |

OTHER PUBLICATIONS

CN Office Action dated Jun. 3, 2020 in Chinese application (No. 201910262266.6).

*Primary Examiner* — Sejoon Ahn
(74) *Attorney, Agent, or Firm* — McClure, Qualey & Rodack, LLP

(57) ABSTRACT

A gain amplifier of a sensing circuit for sensing degradation of an OLED display panel, the gain amplifier comprising: an operation amplifier; and a plurality of gain amplifier cells sequentially coupled to the operation amplifier. Each of the gain amplifier cells comprises a plurality of capacitors each placed between two internal nodes of the gain amplifier cell, excluding a ground node, such that a voltage gain of the gain amplifier and a DC offset of the gain amplifier are determined according to capacitances of the capacitors without considering parasitic capacitance.

6 Claims, 10 Drawing Sheets

(52) U.S. Cl.
CPC .............. *H03F 2203/45156* (2013.01); *H03F 2203/45544* (2013.01); *H03F 2203/45586* (2013.01)

(56) References Cited

U.S. PATENT DOCUMENTS

| | | | | |
|---|---|---|---|---|
| 8,767,001 B2* | 7/2014 | Choi | .................... | G09G 3/3648 345/589 |
| 9,069,425 B2 | 6/2015 | Shin et al. | | |
| 9,412,308 B2 | 8/2016 | Min et al. | | |
| 9,530,356 B2 | 12/2016 | Min et al. | | |
| 9,620,053 B2 | 4/2017 | Kim et al. | | |
| 2002/0135312 A1* | 9/2002 | Koyama | ............... | G09G 3/3225 315/169.3 |
| 2002/0135421 A1* | 9/2002 | Phanse | ................ | H03F 3/45183 330/257 |
| 2002/0140692 A1* | 10/2002 | Sandhu | .................. | G09G 5/006 345/418 |
| 2002/0145600 A1* | 10/2002 | Morita | .................. | G09G 3/2011 345/211 |
| 2002/0175763 A1* | 11/2002 | Dasgupta | ............ | H03F 3/45183 330/301 |
| 2002/0180369 A1* | 12/2002 | Koyama | ................. | C09K 11/06 315/169.1 |
| 2002/0180675 A1* | 12/2002 | Tobita | .................... | G09G 3/006 345/87 |
| 2002/0183019 A1* | 12/2002 | Dent | ..................... | H03F 1/0222 455/108 |
| 2002/0186192 A1* | 12/2002 | Maruoka | ................... | G09G 3/20 345/87 |
| 2002/0190784 A1* | 12/2002 | Watson | ..................... | H03F 1/26 327/560 |
| 2002/0190971 A1* | 12/2002 | Nakamura | ........... | G09G 3/2011 345/204 |
| 2002/0190973 A1* | 12/2002 | Morita | ................. | G09G 3/3614 345/204 |
| 2002/0190974 A1* | 12/2002 | Morita | ................. | G09G 3/3614 345/208 |
| 2010/0328289 A1 | 12/2010 | Enrin et al. | | |

* cited by examiner

GAIN AMPLIFIER FOR REDUCING INTER-CHANNEL ERROR

CROSS-REFERENCE TO RELATED ART

This application claims the benefit of U.S. Patent Provisional application Ser. No. 62/651,287, filed Apr. 2, 2018, the disclosure of which is incorporated by reference herein in its entirety.

TECHNICAL FIELD

The disclosure relates in general to a gain amplifier and a gain amplifier cell for reducing inter-channel error.

BACKGROUND

Display panel has been widely used in a variety of electronic devices in modern technology, such as cellular phone, television, personal computer, and so on. One of the display technologies commonly used is organic light emitting diode (OLED) display. In convention, an OLED display may suffer from OLED degradation after long time usage, and hence image compensation technique is usually needed.

FIG. 1A (PRIOR ART) shows a display device 100 according to the related art. The display device 100 includes an OLED panel 110, a source driver 120, and a system-on-chip (SOC) 130 for image processing, such as a timing controller or an image processor. FIG. 1B shows a schematic diagram of pixel circuits P, data lines DL and sensing lines SL of the OLED panel 110 according to the related art. The source driver 120 includes a data driving circuit that generates data voltages to drive the OLED panel 110 and a sensing circuit that senses signals from the OLED panel 110 for compensating OLED degradation. In FIG. 1A, the data driving circuit of the source driver 120 is illustratively represented by a receiver interface 121, a digital-to-analog converter (DAC) 122 and an output buffer circuit 123, and the sensing circuit of the source driver 120 is illustratively represented by a gain amplifier 124, an analog-to-digital converter (ADC) 125, and a transmitter interface 126. As shown in FIG. 1B, the source driver 120 includes a first plurality of output nodes ON and a second plurality of sensing nodes SN. Each output node ON is coupled to a respective one (or more) data line DL of the OLED panel 110. Each sensing node SN is coupled a respective sensing line SL (which is coupled to a plurality of pixel circuits P) of the OLED panel 110. Specifically, the SOC 130 sends a digital image data to the source driver 120, and the DAC 122 in the source driver 120 converts the digital image data to an analog voltage for driving the OLED panel 110 via the output buffer circuit 123 (which including a plurality of buffers B). The gain amplifier 124 in the sensing circuit samples the sensing voltage from the sensing lines of the OLED panel 110 via the sensing nodes SN and converts the sensing voltage to have proper voltage level for ADC operation. The ADC 125 in the sensing circuit converts the analog voltage (i.e. the sensing voltage from the gain amplifier 124) to a digital code, such that the SOC 130 may detect how severe the OLED degradation is and determine how to compensate the digital image data supplied to the source driver 120. The SOC 130 then adjusts the digital image data according to the received digital codes from the ADC 125.

FIG. 2 shows an example of the gain amplifier 124 according to the related art. The gain amplifier 124 includes an operational amplifier (OP) 210 and multiple gain amplifier (GA) cells 220_1-220_N, wherein each GA cell is coupled to a sensing line SL of the OLED panel 110. A corresponding sensing line SL and a corresponding one among the GA cells 220_1-220_N are regarded as a sensing channel. For example, N is an integer ranging from 150 to 200. The OP 210 is shared among the multiple GA cells 220_1-220_N to save circuit hardware area and reduce power consumption.

The gain amplifier of the related art may suffer from inter-channel error that decreases operating efficiency of the sensing circuit. Therefore \Therefore, the circuit structure of the GA cell is a key issue to the operating efficiency of the sensing circuit. The disclosure provides a gain amplifier and a gain amplifier cell for reducing inter-channel error.

SUMMARY

According to one embodiment, provided is a gain amplifier 1. A gain amplifier of a sensing circuit for sensing degradation of an OLED display panel, the gain amplifier comprising: an operation amplifier, comprising a plurality of output nodes; and a plurality of gain amplifier cells coupled to the operation amplifier, wherein the gain amplifier cells are sequentially coupled to the operation amplifier. Each of the gain amplifier cells comprises: a plurality of input nodes, for receiving a sensing voltage from a sensing line of the OLED display panel, a plurality of reference voltages, a sampling clock signal and a hold clock signal, respectively; a plurality of output nodes coupled to the plurality of output nodes of the operation amplifier, respectively; a plurality of sampling switches coupled to the plurality of input nodes, wherein the sampling switches being controlled by the sampling clock signal; a plurality of hold switches coupled to the plurality of input nodes, wherein the hold switches being controlled by the hold clock signal; and a plurality of capacitors coupled to the sampling switches and the hold switches; wherein each of the plurality of capacitors is placed between two internal nodes of the gain amplifier cell, excluding a ground node, such that a voltage gain of the gain amplifier and a DC offset of the gain amplifier are determined according to capacitances of the capacitors without considering parasitic capacitance.

Figure 1A:
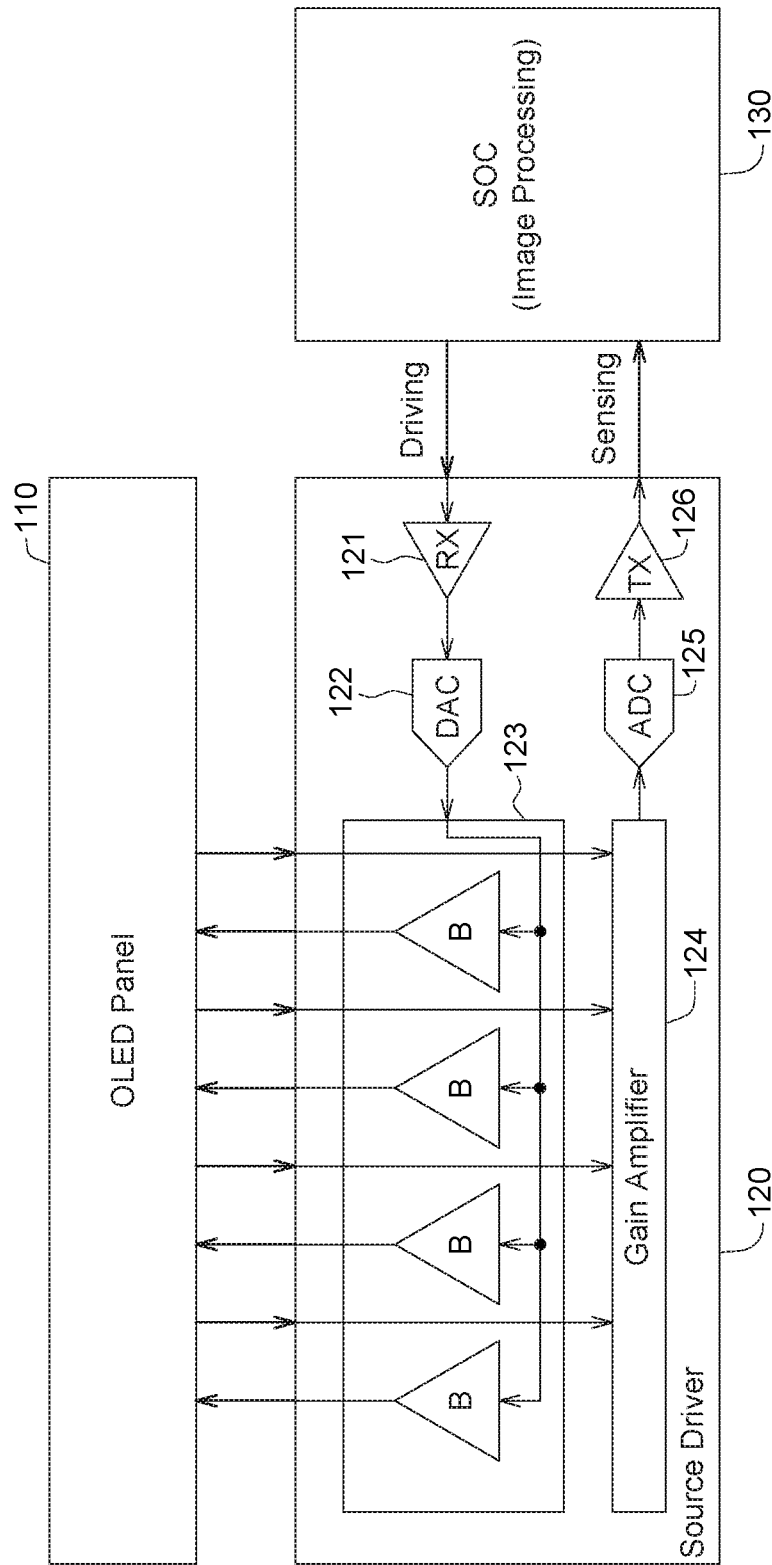
FIG. 1A (PRIOR ART) shows a display device according to the related art.
Figure 1B:
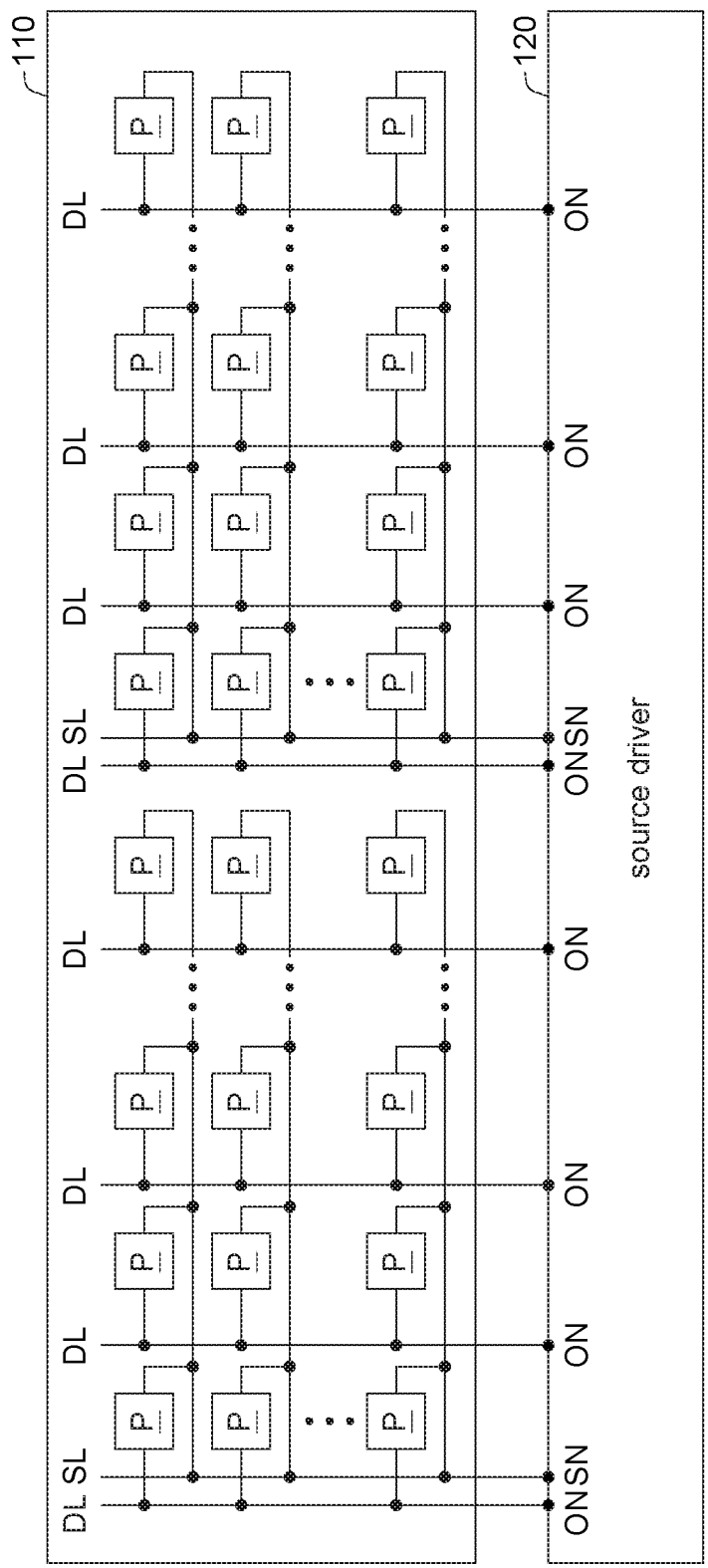
FIG. 1B (PRIOR ART) shows a schematic diagram of pixel circuits, data lines and sensing lines of the OLED panel according to the related art.
Figure 2:
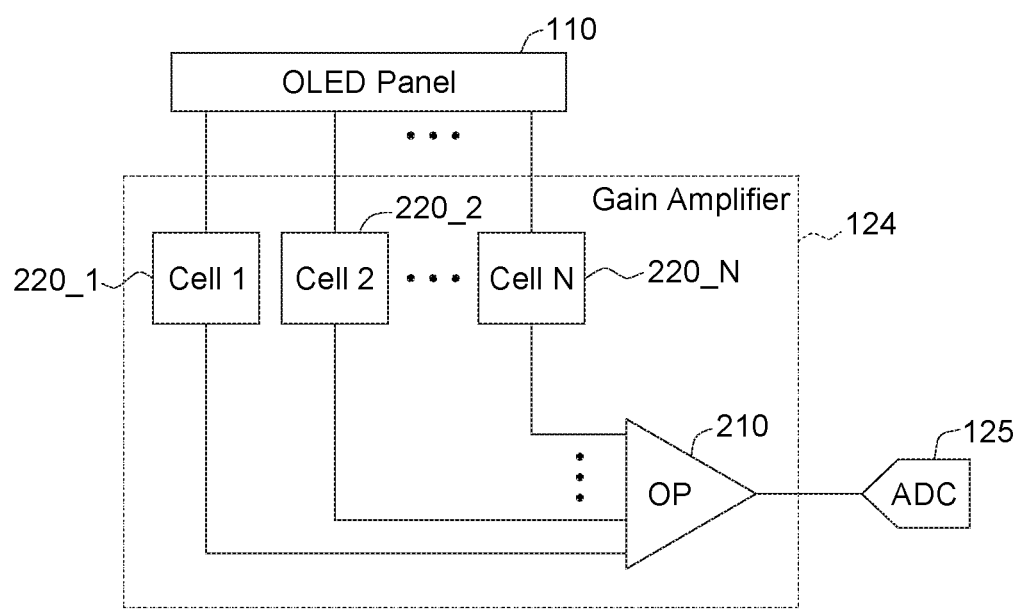
FIG. 2 (PRIOR ART) shows an example of the gain amplifier according to the related art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 3:
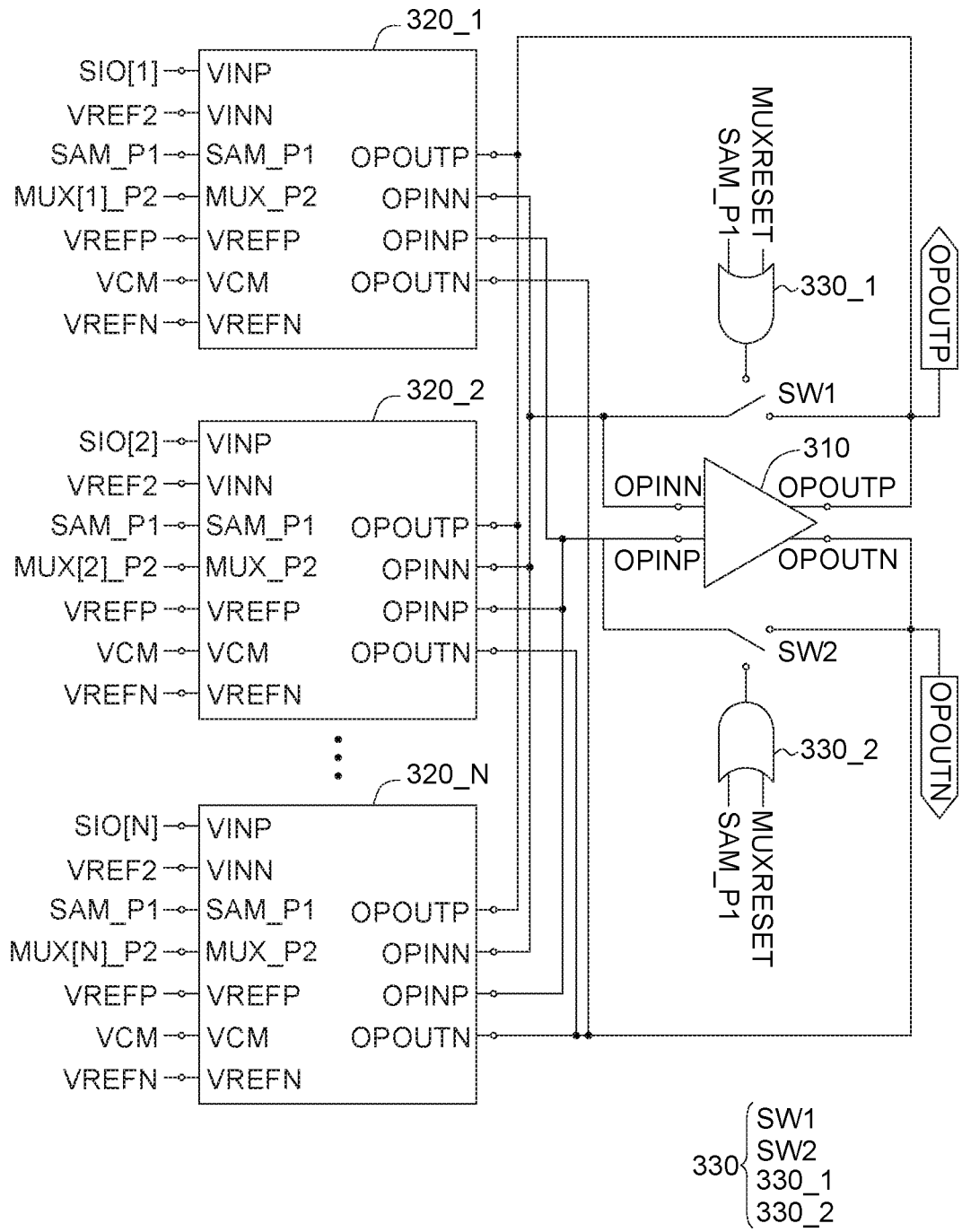
FIG. 3 shows a circuit diagram of a gain amplifier according to one embodiment of this disclosure.

FIG. 3 shows a circuit diagram of a gain amplifier 300 according to one embodiment of this disclosure. The gain amplifier 300 adopts differential voltage input and differential voltage output scheme, such that the common mode noise may be canceled. The gain amplifier 300 includes an OP 310, multiple gain amplifier (GA) cells 320_1-320_N and an OP reset circuit 330. The OP 310 has a positive input node OPINP, a negative input node OPINN, a positive output node OPOUTP and a negative output node OPOUTN. The gain amplifier 300 is included in a sensing circuit for sensing degradation of an OLED display panel.

The circuit structure of each of the GA cells 320_1-320_N may be the same or similar. Each of the GA cells 320_1-320_N has the following input nodes: VINP, VINN, SAM_P1, MUX_P2, VREFP, VCM, VREFN, and has the following output nodes: OPINN, OPINP, OPOUTN, and OPOUTP.

The node VINP is a positive input node of the GA cell, and is configured to receive the sensing voltage from the OLED panel (not shown). For example, the node VINP of the GA cell 320_1 receives the sensing voltage SIO[1], the node VINP of the GA cell 320_2 receives the sensing voltage SIO[2], ..., and the node VINP of the GA cell 320_N receives the sensing voltage SIO[N], where SIO[1]-SIO[N] represents the respective sensing voltages of N sensing channels.

The node VINN is a negative input node of the GA cell, and is configured to receive a reference voltage $V_{REF2}$. Every GA cell may receive the same reference voltage $V_{REF2}$, which acts as the low reference voltage level. For example, the reference voltage $V_{REF2}$ is 0V. The differential input voltage input to the GA cell 320_1 may be represented as $(SIO[1]-V_{REF2})$ and so on.

The nodes VREFP, VCM, VREFN of the GA cells 320_1-320_N are configured to receive three reference voltage levels $V_{REFP}$, $V_{CM}$, $V_{REFN}$ corresponding to the output voltage level of the gain amplifier 300. For example, the reference voltage $V_{REFP}$ is a top reference voltage (such as 1.5V), the reference voltage $V_{REFN}$ is a bottom reference voltage (such as 0.5V), and the reference voltage $V_{CM}$ is the average of $V_{REFP}$ and $V_{REFN}$ (such as 1.0V).

A sampling clock signal SAM_P1 is provided to the input node SAM_P1 of every GA cell. Hold clock signals MUX[1]_P2 to MUX[N]_P2 are respectively provided to the nodes MUX_P2 of the GA cells 320_1-320_N. The node MUX_P2 of the GA cell 320_1 receives the hold clock signal MUX[1]_P2, the node MUX_P2 of the GA cell 320_2 receives the hold clock signal MUX[2]_P2, ..., and the node MUX_P2 of the GA cell 320_N receives the hold clock signal MUX[N]_P2.

The output nodes OPINN of the GA cells 320_1-320_N are coupled to the negative input node OPINN of the OP 310. The output nodes OPINP of the GA cells 320_1-320_N are coupled to the positive input node OPINP of the OP 310. The output nodes OPOUTN of the GA cells 320_1-320_N are coupled to the negative output node OPOUTN of the OP 310. The output nodes OPOUTP of the GA cells 320_1-320_N are coupled to the positive output node OPOUTP of the OP 310.

The OP reset circuit 330 includes switches SW1-SW2 and logic gates (for example but not limited by logic OR gates) 330_1-330_2. The first switch SW1 is coupled between the negative input node OPINN of the OP 310 and the positive output node OPOUTP of the OP 310. The first switch SW1 is controlled by a signal generated from the logic OR gate 330_1 and the logic OR gate 330_1 receives a mux reset signal MUXRESET and the sampling clock signal SAM_P1. The second switch SW2 is coupled between the positive input node OPINP of the OP 310 and the negative output node OPOUTN of the OP 310. The second switch SW2 may be controlled by the same signal that controls the first switch SW1 (i.e. controlled by the signal generated from the logic OR gate 330_1). Alternatively, the second switch SW2 may be controlled by a signal generated from the logic OR gate 330_2 and the logic OR gate 330_2 receives the mux reset signal MUXRESET and the sampling clock signal SAM_P1, as shown in FIG. 3.

Figure 4:
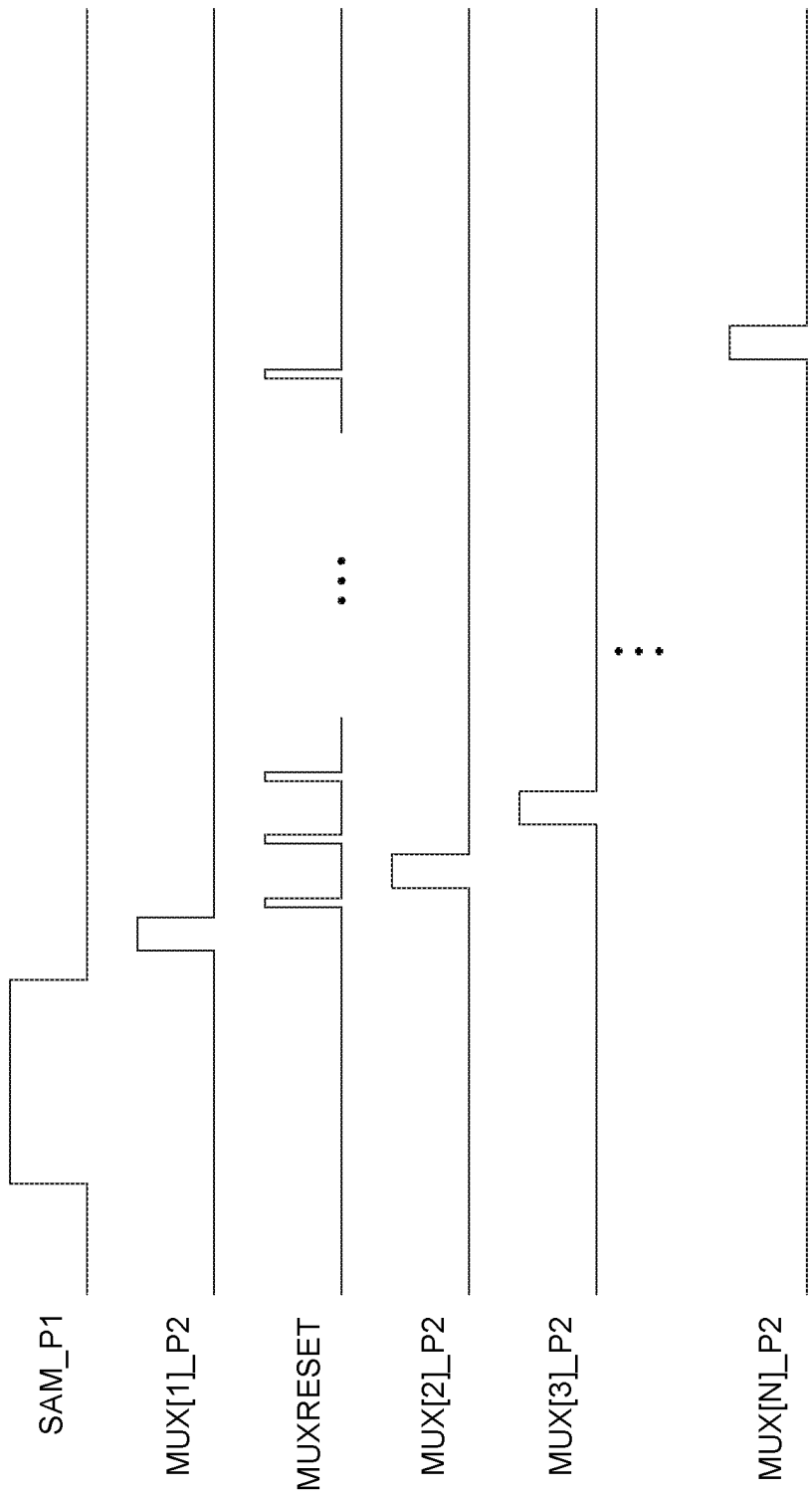
FIG. 4 shows a timing diagram of the sampling phase, the hold phase and the reset phase of the gain amplifier of FIG. 3.

In the embodiment of the application, the gain amplifier 300 has three operation phases, i.e. a sampling phase, a hold phase and a reset phase. FIG. 4 shows a timing diagram of the sampling phase, the hold phase and the reset phase of the gain amplifier 300 of FIG. 3. In the sampling phase where the sampling clock signal SAM_P1 is enabled, all sensing voltages SIO[1]-SIO[N] from all the sensing channels are sampled. In other words, in the sampling phase, all sensing voltages SIO[1]-SIO[N] from the OLED panel are stored in capacitors of the GA cell 320_1-320_N.

Next, each GA cell sequentially enters the hold phase. In the hold phase, when the hold clock signal MUX[1]_P2 is enabled, the GA cell 320_1 outputs the stored sensing voltage SIO[1] (related to the sensing channel 1) to the OP 310, and the OP 310 processes the different input voltage to generate a differential output voltage to an ADC (not shown). Next, in the hold phase, when the hold clock signal MUX[2]_P2 is enabled, the GA cell 320_2 outputs the stored sensing voltage SIO[2] (related to the sensing channel 2) to the OP 310, and the OP 310 processes the different input voltage to generate a differential output voltage to the ADC (not shown). In this manner, each GA cell successively outputs the sampled sensing voltage SIO[1]-SIO[N] to the ADC via the OP 310, and thus a SOC (not shown) may obtain the digital codes corresponding to the sampled sensing voltages of each channel.

In the embodiment, the mux reset signal MUXRESET is triggered between two successive hold phases, for example, between the enable period of the hold clock signal MUX[1]_P2 and the enable period of the hold clock signal MUX[2]_P2. The mux reset signal MUXRESET may be enabled in response to the falling edge of each hold clock signal. The mux reset signal MUXRESET resets the OP 310 for effectively removing the potential memory effect of the OP 310. The memory effect herein represents the output voltage level of sensing channel 1 may affect the output voltage level of sensing channel 2 because there are remaining charges inside the OP 310. Similarly, the mux reset signal MUXRESET is enabled between the enable period of the hold clock signal MUX[2]_P2 and the enable period of the hold clock signal MUX[3]_P2, so as to prevent the output voltage level of sensing channel 3 from being affected by the output voltage level of sensing channel 2.

When the mux reset signal MUXRESET is triggered, the logic OR gates 330_1 and 330_2 output logic 1 to the switches SW1 and SW2 for conducting the switches SW1 and SW2, respectively. Thus, the OP 310 is reset.

Figure 5:
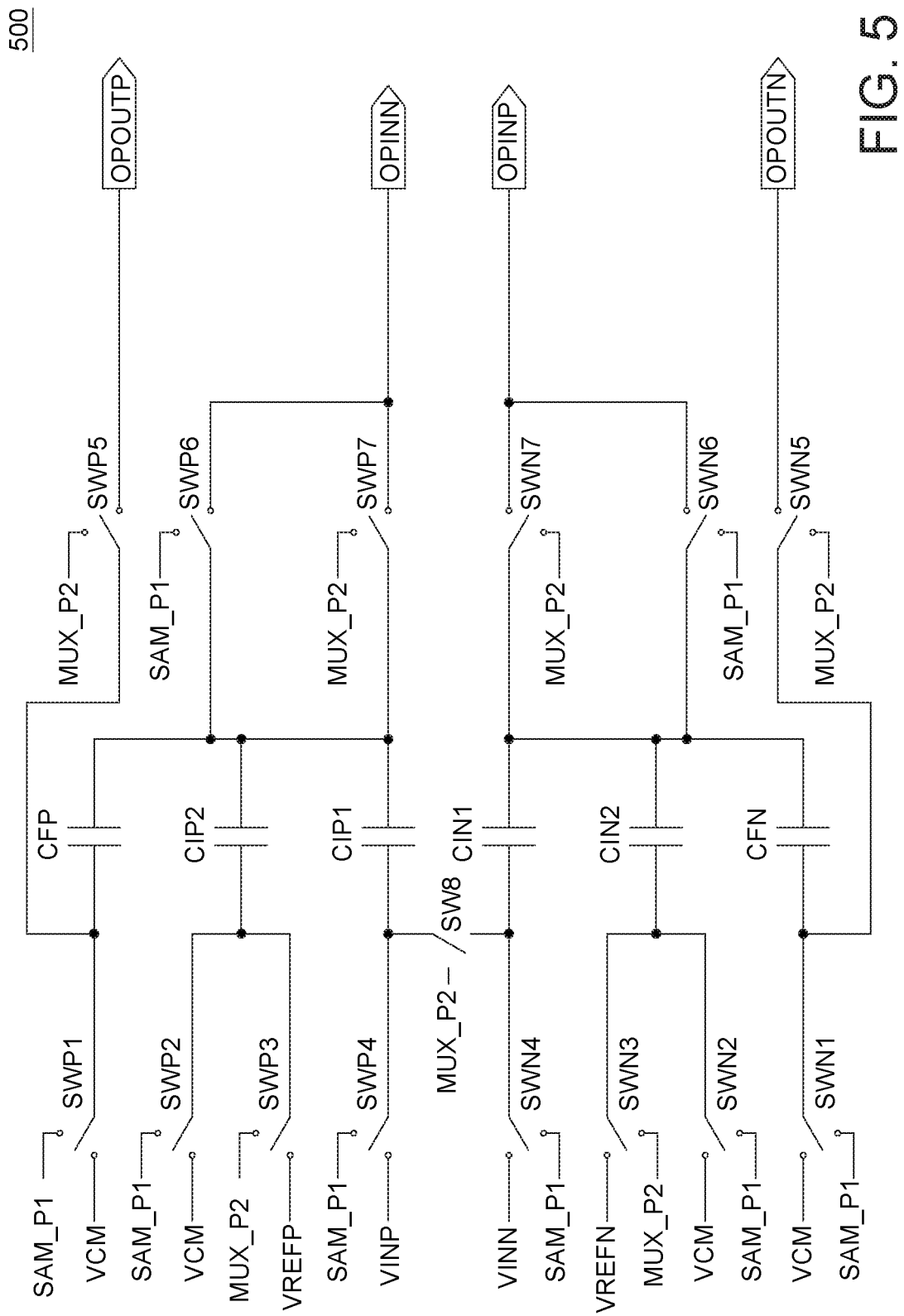
FIG. 5 shows a circuit diagram of a GA cell according to one embodiment of this disclosure.

FIG. 5 shows a circuit diagram of a GA cell 500 according to one embodiment of this disclosure. The GA cell 500 adopts a switched capacitor circuit structure. The circuit structure shown in FIG. 5 may be used in each of the GA cells 320_1-320_N shown in FIG. 3. The GA cell 500 includes a first capacitor CFP, a second capacitor CIP2, a third capacitor CIP1, a fourth capacitor CIN1, a fifth capacitor CIN2, and a sixth capacitor CFN. The capacitors CFP and CFN are feedback capacitors. The symbol of each capacitor represents its capacitance in the following description. Each capacitor has a first terminal and a second terminal. The first terminals of the capacitors CFP, CIP2, CIP1 are coupled together. The first terminals of the capacitors CFN, CIN2, CIN1 are also coupled together. In one embodiment, the capacitance value of capacitor CFP is equal to the capacitance value of capacitor CFN, represented as CFP=CFN=CF. The capacitance value of capacitor CIP1 is equal to the capacitance value of capacitor CIN1, represented as CIP1=CIN1=CI1. The capacitance value of capacitor CIP2 is equal to the capacitance value of capacitor CIN2, represented as CIP2=CIN2=CI2.

The GA cell 500 also includes multiple switches SWP1, SWP2, SWP3, SWP4, SWP5, SWP6, SWP7, SW8, SWN1, SWN2, SWN3, SWN4, SWN5, SWN6, and SWN7.

The switch SWP1 is coupled between the second terminal of the capacitor CFP and the node VCM, and has a control terminal coupled to the node SAM_P1 (i.e. the switch SWP1 is controlled by the sampling clock signal SAM_P1). The switch SWP2 is coupled between the second terminal of the capacitor CIP2 and the node VCM, and has a control terminal coupled to the node SAM_P1. The switch SWP3 is coupled between the second terminal of the capacitor CIP2 and the node VREFP, and has a control terminal coupled to the node MUX_P2. The switch SWP4 is coupled between the second terminal of the capacitor CIP1 and the node VINP, and has a control terminal coupled to the node SAM_P1. The switch SWP5 is coupled between the second terminal of the capacitor CFP and the node OPOUTP, and has a control terminal coupled to the node MUX_P2. The switch SWP6 is coupled between the first terminal of the capacitor CIP2 and the node OPINN, and has a control terminal coupled to the node SAM_P1. The switch SWP7 is coupled between the first terminal of the capacitor CIP1 and the node OPINN, and has a control terminal coupled to the node MUX_P2. The switch SW8 is coupled between the second terminal of the capacitor CIP1 and the second terminal of the capacitor CIN1, and has a control terminal coupled to the node MUX_P2.

The bottom half of the circuit shown in FIG. 5 may be regarded as being symmetrical to the top half of the circuit. The switch SWN1 is coupled between the second terminal of the capacitor CFN and the node VCM, and has a control terminal coupled to the node SAM_P1. The switch SWN2 is coupled between the second terminal of the capacitor CIN2 and the node VCM, and has a control terminal coupled to the node SAM_P1. The switch SWN3 is coupled between the second terminal of the capacitor CIN2 and the node VREFN, and has a control terminal coupled to the node MUX_P2. The switch SWN4 is coupled between the second terminal of the capacitor CIN1 and the node VINN, and has a control terminal coupled to the node SAM_P1. The switch SWN5 is coupled between the second terminal of the capacitor CFN and the node OPOUTN, and has a control terminal coupled to the node MUX_P2. The switch SWN6 is coupled between the first terminal of the capacitor CIN2 and the node OPINP, and has a control terminal coupled to the node SAM_P1. The switch SWN7 is coupled between the first terminal of the capacitor CIN1 and the node OPINP, and has a control terminal coupled to the node MUX_P2.

In the embodiment, in the GA cell, the switches whose control terminal are coupled to the node SAMP_P1 are also referred as the sampling switches (for example, SWP1, SWP2, SWP4, SWP6, SWN1, SWN2, SWN4, SWN6), i.e. the sampling switches are turned on in the sampling phase of the gain amplifier 300. The switch SWP1 may be referred as a first sampling switch. The switch SWP2 may be referred as a second sampling switch. The switch SWP4 may be referred as a third sampling switch. The switch SWP6 may be referred as a fourth sampling switch. The switch SWN1 may be referred as a fifth sampling switch. The switch SWN2 may be referred as a sixth sampling switch. The switch SWN4 may be referred as a seventh sampling switch. The switch SWN6 may be referred as an eighth sampling switch.

In the embodiment, in the GA cell, the switches whose control terminal are coupled to the node MUX_P2 are also referred as the hold switches (for example, SWP3, SWP5, SWP7, SW8, SWN3, SWN5, SWN7), i.e. the hold switches are turned on in the hold phase of the gain amplifier 300. The switch SWP3 may be referred as a first hold switch. The switch SWP5 may be referred as a second hold switch. The switch SWP7 may be referred as a third hold switch. The switch SW8 may be referred as a fourth hold switch. The switch SWN3 may be referred as a fifth hold switch. The switch SWN5 may be referred as a sixth hold switch. The switch SWN7 may be referred as a seventh hold switch.

As described above, each of the GA cell 320_1-320_N in FIG. 3 is sequentially allowed to be coupled to the OP 310 in the hold phase, and thus the following description regarding the operation of each of the GA cell 320_1-320_N takes the OP into consideration along with the GA cell.

Figure 6:
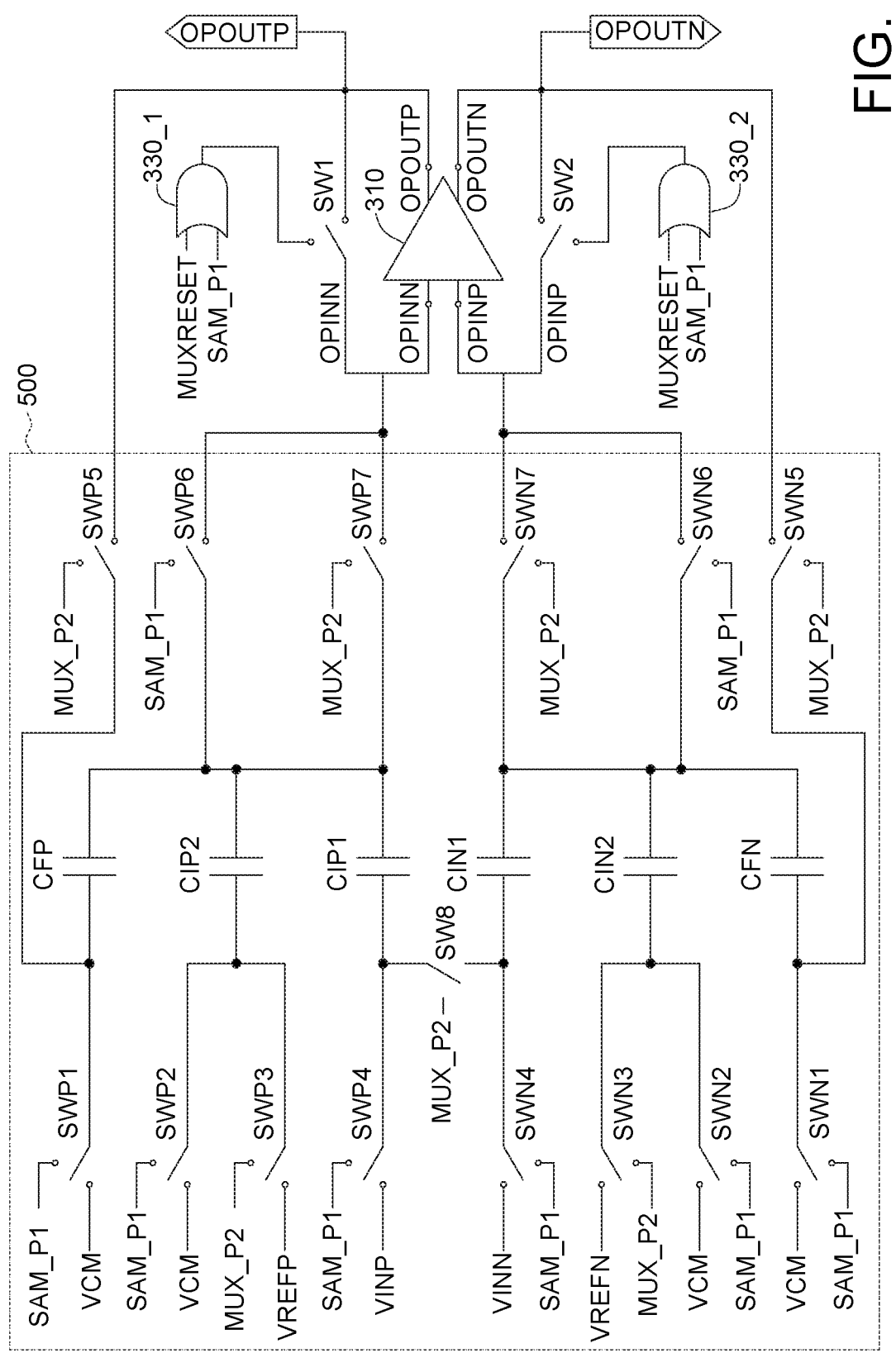
FIG. 6 shows a circuit diagram illustrating the GA cell and the OP according to one embodiment of this disclosure.

FIG. 6 shows a circuit diagram illustrating the GA cell 500 and the OP 310 according to one embodiment of this disclosure. For simplicity, a single GA cell 500 is shown in FIG. 6 (or said, the gain amplifier 300 has a single GA cell (N=1)) but the application is not limited by this. The operation of the gain amplifier 300 shown in FIG. 6 includes a sampling phase, a hold phase, and a reset phase.

Figure 7:
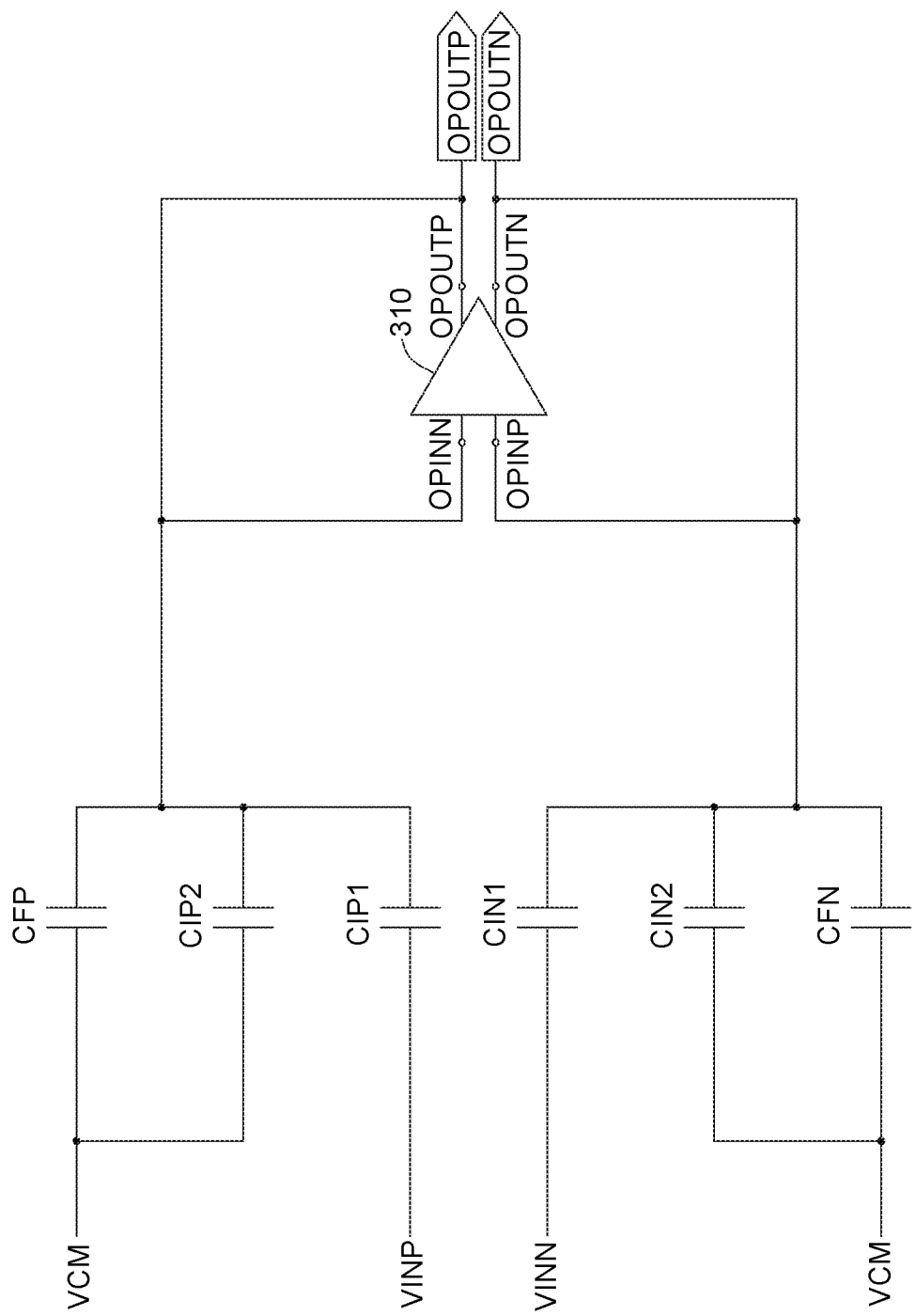
FIG. 7 shows a simplified diagram illustrating the gain amplifier in FIG. 6 operating in the sampling phase according to one embodiment of this disclosure.

FIG. 7 shows a simplified diagram illustrating the gain amplifier 300 in FIG. 6 operating in the sampling phase according to one embodiment of this disclosure. In the sampling phase, the node SAM_P1 of the GA cell receives the sampling clock signal SAM_P1 having a high logic level, and thus the corresponding switches (switches SWP1, SWP2, SWP4, SWP6, SWN1, SWN2, SWN4, SWN6, SW1 and SW2) are turned on. FIG. 7 shows a simplified diagram by ignoring the switches that are turned off.

In the sampling phase, the OP 310 acts as a unity gain buffer because of the feedback path. Assume the OP 310 has an intrinsic input offset voltage $V_{OS}$. As such, the voltage level at the node OPINN (as well as the node OPOUTP) of the OP 310 is equal to the reference voltage $V_{CM}$, and the voltage level at the node OPINP (as well as the node OPOUTN) of the OP 310 is equal to ($V_{CM}+V_{OS}$).

The voltage levels at the node VINP and the node VINN of the GA cell are represented as voltage $V_{INP}$ and $V_{INN}$ respectively. The charge $Q_{CIP1(s)}$ stored in the capacitor CIP1 of the GA cell in the sampling phase may be represented as $Q_{CIP1(s)}=CI1\times(V_{INP}-V_{CM})$. The charge $Q_{CIN1(s)}$ stored in the capacitor CIN1 of the GA cell in the sampling phase may be represented as $Q_{CIN1(s)}=CI1\times[V_{INN}-(V_{CM}+V_{OS})]$. The circuit of the embodiment architecture adopts differential voltage input/output scheme, and the difference between the charge stored in the capacitors CIP1 and CIN1 of the GA cell in the sampling phase may be represented as $Q_{CI1(s)}=Q_{CIP1(s)}-Q_{CIN1(s)}=CI1\times[(V_{INP}-V_{CM})-(V_{INN}-(V_{CM}+V_{OS}))]=CI1\times(V_{INP}-V_{INN}+V_{OS})$ ... eq.(1).

The charge stored in the capacitor CIP2 of the GA cell in the sampling phase may be represented as $Q_{CIP2(s)}=CI2\times(V_{CM}-V_{CM})$. The charge stored in the capacitor CIN2 of the GA cell in the sampling phase may be represented as $Q_{CIN2(s)}=CI2\times[V_{CM}-(V_{CM}+V_{OS})]$. The difference between the charge stored in the capacitors CIP2 and CIN2 of the GA cell in the sampling phase may be represented as $Q_{CI2(s)}=Q_{CIP2(s)}-Q_{CIN2(s)}=CI2\times[(V_{CM}-V_{CM})-(V_{CM}-V_{CM}-V_{OS})]=CI2\times V_{OS}$ ... eq. (2).

The charge stored in the capacitor CFP1 of the GA cell in the sampling phase may be represented as $Q_{CFP1(s)}=CF\times(V_{CM}-V_{CM})$. The charge stored in the capacitor CFN1 of the GA cell in the sampling phase may be represented as $Q_{CFN1(s)}=CF\times[V_{CM}-(V_{CM}+V_{OS})]$. The difference between the charge stored in the capacitors CFP1 and CFN1 may be represented as $Q_{CF(s)}=Q_{CFP1(s)}-Q_{CFN1(s)}=CF\times[(V_{CM}-V_{CM})-(V_{CM}-V_{CM}-V_{OS})]=CF\times V_{OS}$ ... eq. (3).

Figure 8:
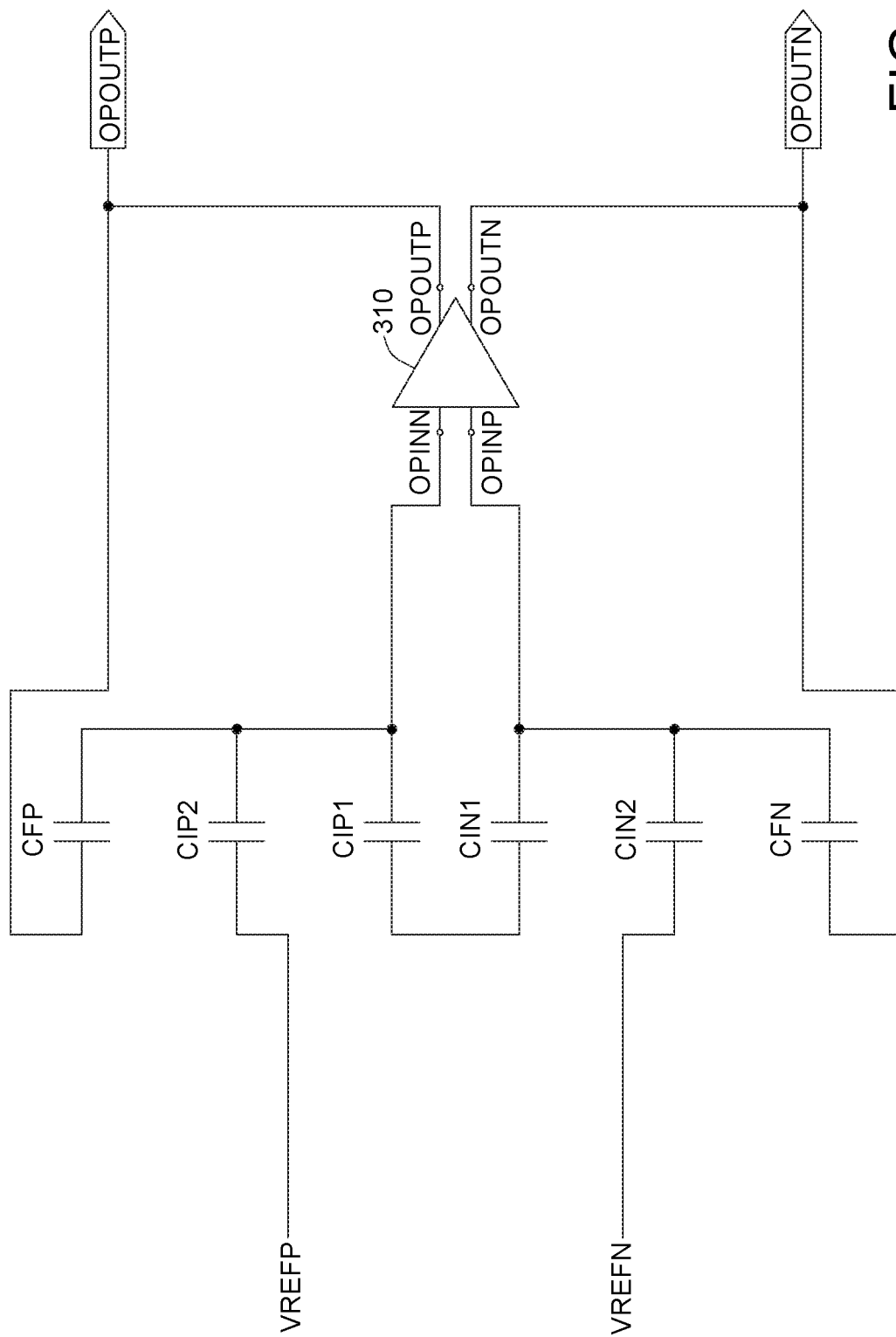
FIG. 8 shows a simplified diagram illustrating the gain amplifier in FIG. 6 operating in the hold phase according to one embodiment of this disclosure.

FIG. 8 shows a simplified diagram illustrating the gain amplifier 300 in FIG. 6 operating in the hold phase according to one embodiment of this disclosure. In the hold phase, the node MUX_P2 of the GA cell receives the corresponding hold clock signal having a high logic level, and thus the corresponding switches (switches SWP3, SWP5, SWP7, SWN3, SWN5, SWN7, and SW8) are turned on. FIG. 8 shows a simplified diagram by ignoring the switches that are turned off.

In the hold phase, the second terminal of the capacitor CIP1 of the GA cell is connected to the second terminal of the capacitor CIN1 of the GA cell. The voltage level at the second terminal of the capacitor CIP1 of the GA cell is represented as $V_{COMM}$. The voltage level at the node OPINN of the OP 310 is equal to the reference voltage $V_{CM}$, and the voltage level at the node OPINP of the OP 310 is equal to ($V_{CM}+V_{OS}$).

The charge $Q_{CIP1(h)}$ stored in the capacitor CIP1 of the GA cell in the hold phase may be represented as $Q_{CIP1(h)}=CI1\times(V_{COMM}-V_{CM})$. The charge $Q_{CIN1(h)}$ stored in the capacitor CIN1 of the GA cell in the hold phase may be represented as $Q_{CIN1(h)}=CI1\times[V_{COMM}-(V_{CM}+V_{OS})]$. The difference between the charge stored in the capacitors CIP1 and CIN1 of the GA cell in the hold phase may be represented as $Q_{CI1(h)}=CI1\times[(V_{COMM}-V_{CM})-(V_{COMM}-V_{CM}-V_{OS})]=CI1\times V_{OS}$ ... eq.(4).

The charge $Q_{CIP2(h)}$ stored in the capacitor CIP2 of the GA cell in the hold phase may be represented as $Q_{CIP2(h)}=CI2\times(V_{REFP}-V_{CM})$. The charge $Q_{CIN2(h)}$ stored in the capacitor CIN2 of the GA cell in the hold phase may be represented as $Q_{CIN2(h)}=CI2\times[V_{REFN}-(V_{CM}+V_{OS})]$. The difference between the charge stored in the capacitors CIP2 and CIN2 of the GA cell in the hold phase may be represented as $Q_{CI2(h)}=CI2\times[(V_{REFP}-V_{CM})-(V_{REFN}-V_{CM}-V_{OS})]=CI2\times(V_{REFP}-V_{REFN}+V_{OS})$ ... eq. (5).

The voltage levels at the node VOPOUTP and the node VOPOUTN of the GA cell are represented as voltage $V_{OPOUTP}$ and $V_{OPOUTN}$ respectively. The charge $Q_{CFP1(h)}$ stored in the capacitor CFP1 of the GA cell in the hold phase may be represented as $Q_{CFP1(h)}=CF\times(V_{OPUTP}-V_{CM})$. The charge $Q_{CFN1(h)}$ stored in the capacitor CFN1 of the GA cell in the hold phase may be represented as $Q_{CFN1(h)}=CF\times[V_{OPOUTN}-(V_{CM}+V_{OS})]$. The difference between the charge stored in the capacitors CFP1 and CFN1 of the GA cell in the hold phase may be represented as $Q_{CF}=CF\times[(V_{OPOUTP}-V_{CM})-(V_{OPOUTN}-V_{CM}-V_{OS})]=CF\times(V_{OPOUTP}-V_{OPOUTN}+V_{OS})$ ... eq. (6).

According to the law of charge conservation, $Q_{CI1(s)}+Q_{CI2(s)}+Q_{CF(s)}=Q_{CI1(h)}+Q_{CI2(h)}+Q_{CF(h)}$. Based on eq.(1) to eq.(6), one can derive the following equation:

$$V_{out} = \left(\frac{CI1}{CF}\right) \times V_{in} + \left(\frac{CI2}{CF}\right) \times V_{ref}, \qquad \text{eq. (7)}$$

where $V_{out}=(V_{OPOUTP}-V_{OPOUTN})$, $V_{in}=(V_{INP}-V_{INN})$, $V_{ref}=(V_{REFP}-V_{REFN})$.

As can be seen in eq.(7), the voltage gain of the gain amplifier 300 depends on the ratio $$\left(\frac{CI1}{CF}\right),$$

and the DC offset of the gain amplifier 300 depends on the ratio $$\left(\frac{CI2}{CF}\right).$$

The voltage gain refers to the change in the signal swing range, and DC offset refers to the shift in the mean amplitude of the voltage signal. For example, the input voltage of the gain amplifier in one example of the embodiment ranges from 0V to +3V, and the output voltage of the gain amplifier in one example of the embodiment ranges from −1V to +1V. The signal swing range changes from 3V to 2V, and the mean amplitude changes from 1.5V to 0V. Based on the modern manufacturing technology, the ratio $$\left(\frac{CI1}{CF}\right)$$

and the ratio $$\left(\frac{CI2}{CF}\right)$$

may be set accurately, for example, the error may be controlled within 0.1% of the nominal value. Therefore, the gain and the DC offset of the gain amplifier in the embodiment of this disclosure may be controlled accurately.

The capacitors CIP1, CIP2, CIN1 and CIN2 in the GA cell 500, which are in equivalent CI1 and CI2 that determine the ratio associated with the gain and DC offset, are placed between two internal nodes of the GA cell, rather than between one node and a ground node. In other words, in FIG. 5, none of the capacitors CIP1, CIP2, CIN1 and CIN2 is coupled to a ground node. Also, as in FIG. 6, each of the capacitors CIP1, CIP2, CIN1 and CIN2 is placed between one node of a switch (which is a sampling switch or a hold switch) and one node of the other switch (which is a sampling switch or a hold switch). In other words, in FIG. 6, none of the capacitors CIP1, CIP2, CIN1 and CIN2 is coupled to a ground node. Such a placement of these capacitors makes the GA cell being insensitive to the parasitic capacitances which may couple to the ground node. In such a way, the voltage gain of the gain amplifier 300 (depending on the ratio $$\left(\frac{CI1}{CF}\right))$$

and the DC offset of the gain amplifier 300 (depending on the ratio $$\left(\frac{CI2}{CF}\right))$$

can be set accurately and are not influenced by the parasitic capacitance effect.

In addition, the term $V_{OS}$ does not appear in the eq.(7), and thus the input offset voltage of the OP in the embodiment does not affect the gain and the DC offset of the gain amplifier. Moreover, the gain and the DC offset do not depend on input voltage level or temperature, and thus the gain amplifier in this disclosure is immune to process variation. Based on the reasons stated above (the gain and the DC offset affected by capacitance value, but not affected by input offset of OP, input voltage level, temperature), each gain amplifier cell for each sensing channel may have an almost identical characteristic, effectively reducing inter-channel errors in the gain amplifier used in the display device. That is, each sensing channel may have the same gain and the same DC offset, and thus a better image compensation quality may be achieved.

Figure 9:
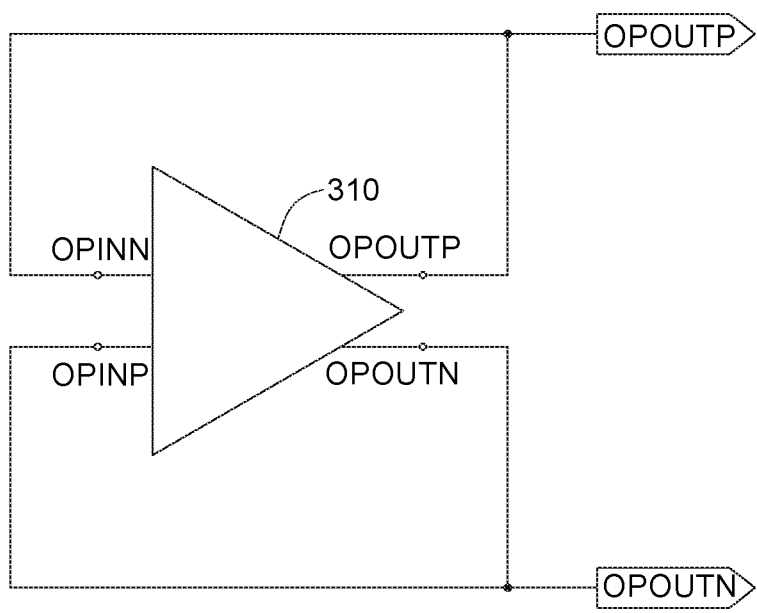
FIG. 9 shows a simplified diagram illustrating the gain amplifier in FIG. 6 operating in the reset phase according to one embodiment of this disclosure.

FIG. 9 shows a simplified diagram illustrating the gain amplifier 300 in FIG. 6 operating in the reset phase according to one embodiment of this disclosure. The mux reset signal MUXRESET is enabled in the reset phase, and thus the OP 310 acts as a unity gain buffer because of the feedback path. The OP 310 is isolated from the capacitors CFP, CIP2, CIP1, CIN1, CIN2, and CFN in the GA cell because the switches SWP5, SWP6, SWP7, SWN5, SWN6, and SWN7 are turned off. The reset phase is between two successive hold phases, such as between the hold phase of sensing channel 1 and the hold phase of sensing channel 2. Because the OP 310 is reset in the reset phase, the voltage levels at the OP 310 in the hold phase of sensing channel 1 will not affect the voltage levels at the OP 310 in the hold phase of sensing channel 2, effectively preventing the memory effect at the OP 310.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A gain amplifier of a sensing circuit for sensing degradation of an OLED display panel, the gain amplifier comprising:
   an operation amplifier, comprising a plurality of input nodes and a plurality of output nodes; and
   a plurality of gain amplifier cells coupled to the operation amplifier, wherein the plurality of gain amplifier cells are coupled to the operation amplifier and each of the gain amplifier cells comprises:
   a plurality of input nodes, for receiving a sensing voltage from a sensing line of the OLED display panel, a plurality of reference voltages, a sampling clock signal and a hold clock signal, respectively, the plurality of reference voltages including a first reference voltage, a second reference voltage, a third reference voltage and a fourth reference voltage;
   a plurality of output nodes, each of the plurality of output nodes of each of the gain amplifier cells being coupled to a corresponding one among the plurality of input nodes of the operation amplifier and the plurality of output nodes of the operation amplifier, respectively;
   a plurality of sampling switches coupled to the plurality of input nodes, wherein the sampling switches being controlled by the sampling clock signal;
   a plurality of hold switches coupled to the plurality of input nodes, wherein the hold switches being controlled by the hold clock signal; and
   a plurality of capacitors coupled to the sampling switches and the hold switches, the plurality of capacitors including a first capacitor, a second capacitor, a third capacitor, a fourth capacitor, a fifth capacitor and a sixth capacitor, wherein the first capacitor and the sixth capacitor are feedback capacitors;
   wherein each of the plurality of capacitors is placed between two internal nodes of the gain amplifier cell, excluding a ground node, such that a voltage gain of the gain amplifier and a DC offset of the gain amplifier are determined according to capacitances of the capacitors;
   in a sampling phase, the sensitive voltage is coupled to the negative input node of the operation amplifier via the third capacitor, the third reference voltage is coupled to the negative input node of the operation amplifier via the second capacitor, the first reference voltage is coupled to the positive input node of the operation amplifier via the fourth capacitor; and the third reference voltage is coupled to the positive input node of the operation amplifier via the fifth capacitor; and
   in a hold phase, the fourth reference voltage is coupled to the positive input node of the operation amplifier via the fifth capacitor, the second reference voltage is coupled to the negative input node of the operation amplifier via the second capacitor, the third capacitor having a first terminal coupled to a first terminal of the fourth capacitor, and a second terminal coupled to the negative input node of the operation amplifier, the fourth capacitor having the first terminal coupled to the first terminal of the third capacitor, and a second terminal coupled to the positive input node of the operation amplifier.

2. The gain amplifier according to claim 1, wherein the plurality of input nodes of each of the gain amplifier cells includes:
   a first input node for receiving the sensing voltage;
   a second input node for receiving the first reference voltage among the plurality of reference voltages;

a third input node for receiving the second reference voltage among the plurality of reference voltages;

a fourth input node for receiving the third reference voltage among the plurality of reference voltages;

a fifth input node for receiving the fourth reference voltage among the plurality of reference voltages;

a sixth input node for receiving the sampling clock signal; and a seventh input node for receiving the hold clock signal.

3. The gain amplifier according to claim 2, wherein the plurality of output nodes of each of the gain amplifier cells includes:

a first output node coupled to a negative input node of the operation amplifier;

a second output node coupled to a positive input node of the operation amplifier;

a third output node coupled to a negative output node of the operation amplifier; and a fourth output node coupled to a positive output node of the operation amplifier.

4. The gain amplifier according to claim 3, wherein none of the second capacitor, the third capacitor, the fourth capacitor and the fifth capacitor is coupled to a ground node, first terminals of the first, the second and the third capacitors are coupled together;

first terminals of the fourth, the fifth and the sixth capacitors are coupled together;

a capacitance value of the first capacitor is equal to a capacitance value of the sixth capacitor;

a capacitance value of the second capacitor is equal to a capacitance value of the fifth capacitor; and a capacitance value of the third capacitor is equal to a capacitance value of the fourth capacitor.

5. The gain amplifier according to claim 4, wherein the plurality of sampling switches includes:

a first sampling switch being coupled between a second terminal of the first capacitor and the fourth input node, and having a control terminal coupled to the sixth input node;

a second sampling switch being coupled between a second terminal of the second capacitor and the fourth input node, and having a control terminal coupled to the sixth input node;

a third sampling switch being coupled between the second terminal of the third capacitor and the first input node, and having a control terminal coupled to the sixth input node;

a fourth sampling switch being coupled between the first terminal of the second capacitor and the first output node, and having a control terminal coupled to the sixth input node;

a fifth sampling switch being coupled between a second terminal of the sixth capacitor and the fourth input node, and having a control terminal coupled to the sixth input node;

a sixth sampling switch being coupled between a second terminal of the fifth capacitor and the fourth input node, and having a control terminal coupled to the sixth input node;

a seventh sampling switch being coupled between the second terminal of the fourth capacitor and the second input node, and having a control terminal coupled to the sixth input node; and an eighth sampling switch being coupled between the first terminal of the fifth capacitor and the second output node, and having a control terminal coupled to the sixth input node.

6. The gain amplifier according to claim 5, wherein the plurality of hold switches includes:

a first hold switch being coupled between the second terminal of the second capacitor and the third input node, and having a control terminal coupled to the seventh input node;

a second hold switch being coupled between the second terminal of the first capacitor and the fourth output node, and having a control terminal coupled to the seventh input node;

a third hold switch being coupled between the first terminal of the third capacitor and the first output node, and having a control terminal coupled to the seventh input node;

a fourth hold switch being coupled between the second terminal of the third capacitor and the second terminal of the fourth capacitor, and having a control terminal coupled to the seventh input node;

a fifth hold switch being coupled between the second terminal of the fifth capacitor and the fifth input node, and having a control terminal coupled to the seventh input node;

a sixth hold switch being coupled between the second terminal of the sixth capacitor and the third output node, and having a control terminal coupled to the seventh input node; and a seventh hold switch being coupled between the first terminal of the fourth capacitor and the second output node, and having a control terminal coupled to the seventh input node.

* * * * *